US010908349B2

(12) United States Patent
Cheng et al.

(10) Patent No.: US 10,908,349 B2
(45) Date of Patent: Feb. 2, 2021

(54) WIRELESS LIGHT BOARD

(71) Applicant: Zealio Electronics Co., Ltd., Hsinchu (TW)

(72) Inventors: C. P. Cheng, Hsinchu (TW); Pao-Lin Guo, Hsinchu (TW)

(73) Assignee: ZEALIO ELECTRONICS CO., LTD., Hsinchu (TW)

(*) Notice: Subject to any disclaimer, the term of this patent is extended or adjusted under 35 U.S.C. 154(b) by 0 days.

(21) Appl. No.: 16/736,824

(22) Filed: Jan. 8, 2020

(65) Prior Publication Data
US 2020/0142123 A1 May 7, 2020

Related U.S. Application Data

(63) Continuation-in-part of application No. 16/285,230, filed on Feb. 26, 2019, now abandoned, which is a continuation-in-part of application No. 14/265,972, filed on Apr. 30, 2014, now abandoned.

(30) Foreign Application Priority Data

Feb. 14, 2014 (TW) .............................. 103105049 A
Feb. 14, 2014 (TW) .............................. 103202685 U

(51) Int. Cl.
H05B 47/115 (2020.01)
F21V 8/00 (2006.01)
H03K 17/95 (2006.01)

(52) U.S. Cl.
CPC ....... G02B 6/0073 (2013.01); H03K 17/9517 (2013.01); H05B 47/115 (2020.01)

(58) Field of Classification Search
CPC ........ B60Q 1/2669; B60Q 1/50; B60Q 1/323; B60R 13/00; B60R 13/005; B60R 13/04; B60R 13/02; G09F 21/04; G02B 6/0018; G02B 6/006; G02B 6/0038; G02B 6/0061;
(Continued)

(56) References Cited

U.S. PATENT DOCUMENTS

2008/0164867 A1* 7/2008 Steinich ............... G01D 11/245
324/207.2
2009/0184655 A1* 7/2009 Miller .................... H05B 45/37
315/291
(Continued)

Primary Examiner — Rajarshi Chakraborty
Assistant Examiner — Fatima N Farokhrooz
(74) Attorney, Agent, or Firm — Che-Yang Chen; Law Office of Michael Chen

(57) ABSTRACT

A wireless light board is disclosed herein. The present invention comprises a baseplate, a backlight module, a power module, a magnet sensor module, a control module, at least one bottom cover, and a top cover. The baseplate has a recess and a power source accommodation hole to respectively accommodate the backlight module and the power module. The control module is arranged on a circuit board and electrically connected with the backlight module and the magnet sensor module to turn on/off the backlight module. The bottom cover removably covers the power source accommodation hole. The top cover covers at least the backlight module and the power module and has a first light-permeable region above the backlight module. Thereby, the wireless light board is slim, waterproof, power-saving, easy to install, and convenient for battery replacement.

11 Claims, 11 Drawing Sheets

(58) Field of Classification Search
CPC . G02B 6/0068; G02B 6/0073; Y10S 362/812; H05B 47/115; H03K 17/9517
See application file for complete search history.

(56) References Cited

U.S. PATENT DOCUMENTS

| | | | |
|---|---|---|---|
| 2010/0213931 A1* | 8/2010 | Suzuki | B60R 25/1004 324/207.22 |
| 2011/0193663 A1* | 8/2011 | Peczalski | G07C 9/00309 335/179 |
| 2016/0360987 A1* | 12/2016 | Miyasaka et al. | G01D 11/245 324/207.2 |
| 2019/0171219 A1* | 6/2019 | Akutsu | G05D 1/0223 |

* cited by examiner

Φ10*1.0T mm (N) H: 7.5 mm

| mm | 10 | 7.5 | 5 | 2.5 | 0 | 2.5 | 5 | 7.5 | 10 |
|---|---|---|---|---|---|---|---|---|---|
| 10 | X | X | X | X | X | X | X | X | X |
| 7.5 | X | X | X | X | X | X | X | X | X |
| 5 | X | X | X | X | X | X | X | X | X |
| 2.5 | X | X | X | O | O | O | X | X | X |
| 0 | X | X | X | O | Sensor | O | X | X | X |
| 2.5 | X | X | X | O | O | O | X | X | X |
| 5 | X | X | X | X | X | X | X | X | X |
| 7.5 | X | X | X | X | X | X | X | X | X |
| 10 | X | X | X | X | X | X | X | X | X |

Φ10*1.0T mm (S) H: 7.5 mm

| mm | 10 | 7.5 | 5 | 2.5 | 0 | 2.5 | 5 | 7.5 | 10 |
|---|---|---|---|---|---|---|---|---|---|
| 10 | X | X | X | X | X | X | X | X | X |
| 7.5 | X | X | X | X | X | X | X | X | X |
| 5 | X | O | O | O | O | O | X | X | X |
| 2.5 | X | O | O | O | O | O | O | X | X |
| 0 | X | O | O | O | Sensor | O | O | X | X |
| 2.5 | X | O | O | O | O | O | O | X | X |
| 5 | X | X | O | O | O | O | X | X | X |
| 7.5 | X | X | X | X | X | X | X | X | X |
| 10 | X | X | X | X | X | X | X | X | X |

WIRELESS LIGHT BOARD

CROSS REFERENCE

The application is a continuation-in-part application of the U.S. patent application Ser. No. 16/285,230 filed on Feb. 26, 2019, which is a continuation-in-part of the U.S. patent application Ser. No. 14/265,972 filed on Apr. 30, 2014, which claims the priority of Taiwanese patent application Nos. 103202685 and 103105049, both filed on Feb. 14, 2014. The contents of all of the above are incorporated herein by reference.

BACKGROUND OF THE INVENTION

1. Field of the Invention

The present invention relates to a light board, particularly to a wireless light board.

2. Description of the Prior Art

In some of the automotive vehicles, usually is embedded a light-emitting board on the threshold of the floor in order to form a visual effects pedal or a lighting welcome pedal. In general, such light-emitting pedal comprises a plurality of LEDs (Light Emitting Diodes) or a lamp as an illuminant disposed behind the shielding sheet openings to produce the visual effect, and these openings are usually designed for the automobile brand recognition including text or graphics.

In conventional lighting welcome pedals, infrared switches or ultrasonic switches are used to turn on/off the lights. These kinds of switches consume much power, hence they need to be powered by electricity of the vehicle. However, the cables for powering the infrared switches or the ultrasonic switches are hard to install. Besides, the infrared switches or the ultrasonic switches normally have shorter life cycle due to high power consumption.

On the other hand, a visual effects pedal or a lighting welcome pedal of the prior art is also used for safety application. For example, through utilizing its visual effect, visual effects pedal or a lighting welcome pedal is frequently used for recognition or confirmation whether the door of car or vehicle is firmly closed or not, or detection whether the door of car or vehicle is incidentally opening during moving and other unexpectable occasions. However, depending on human sight, some unexpected accidents are reported frequently.

In order to avoid such unexpected accidents, in the recent years, aforesaid visual effects pedal or a lighting welcome pedal of the prior art is combined with a magnet which is disposed on the door to be used as a magnet sensor module for detecting out whether door of car or vehicle is opening or closed. However, the accuracy in detecting out whether door of car or vehicle is opening or closed is not satisfied owing to that detection area is limited, improper magnet is utilized, or other reasons.

Therefore, the manufacturers are eager to develop new types of light boards with several merits such as high accuracy and sensitivity in detecting our whether the door of car is opening or closed, and another excellent performance to solve the abovementioned problems.

SUMMARY OF THE INVENTION

One objective of the present invention is to provide a wireless light board having several merits such as slim, compact size, waterproof, power-efficient with lower power consumption, easy to be installed and convenient to replace batteries therefrom, high sensitivity in detecting variation of magnetic field intensity, large detection area, high accuracy in detecting our whether the door of car is opening or closed, and others.

To achieve the abovementioned objective, one embodiment of the present invention proposes a wireless light board, which comprises a baseplate, a backlight module, a power module, a proximity sensor module, a control module, at least one bottom cover, and a top cover. The baseplate has an upper surface and a lower surface. The upper surface has at least one recess and a power source accommodation hole is arranged on at least one side of the recess. A positioning portion is defined on at least one side of the baseplate. The backlight module is accommodated by the recess and the backlight module has at least one circuit board. The power module includes at least one battery and at least one conductive strip, wherein the battery is arranged inside the power source accommodation hole; and the conductive strip is used to electrically connect with the battery and the circuit board. The proximity sensor module is arranged on the circuit board and used to sense an induction signal. The control module is arranged on the circuit board, electrically connected with the backlight module and the proximity sensor module, and used to turn on/off the backlight module according to the induction signal. The bottom cover removably covers the power source accommodation hole from the lower surface of the baseplate. The top cover is arranged on the upper surface of the baseplate and covers at least the backlight module and the power module, wherein at least one light-permeable region is formed on the top cover and positioned above the backlight module.

Below, the embodiments are described in detail in cooperation with the attached drawings to make easily understood the objectives, technical contents, characteristics and accomplishments of the present invention.

BRIEF DESCRIPTION OF THE DRAWINGS

FIG. 10 is an illustrated drawing showing the detection area for detecting variation of magnetic field intensity by using a magnet and HALL sensor combined with a visual effects pedal or a lighting welcome pedal of the prior art.

FIG. 12 is an illustrated drawing showing the detection area for detecting variation of magnetic field intensity by using magnet sensor module which is disposed in the wireless light board according to the invention of the present application.

DESCRIPTION OF THE PREFERRED EMBODIMENT

Figure 1:
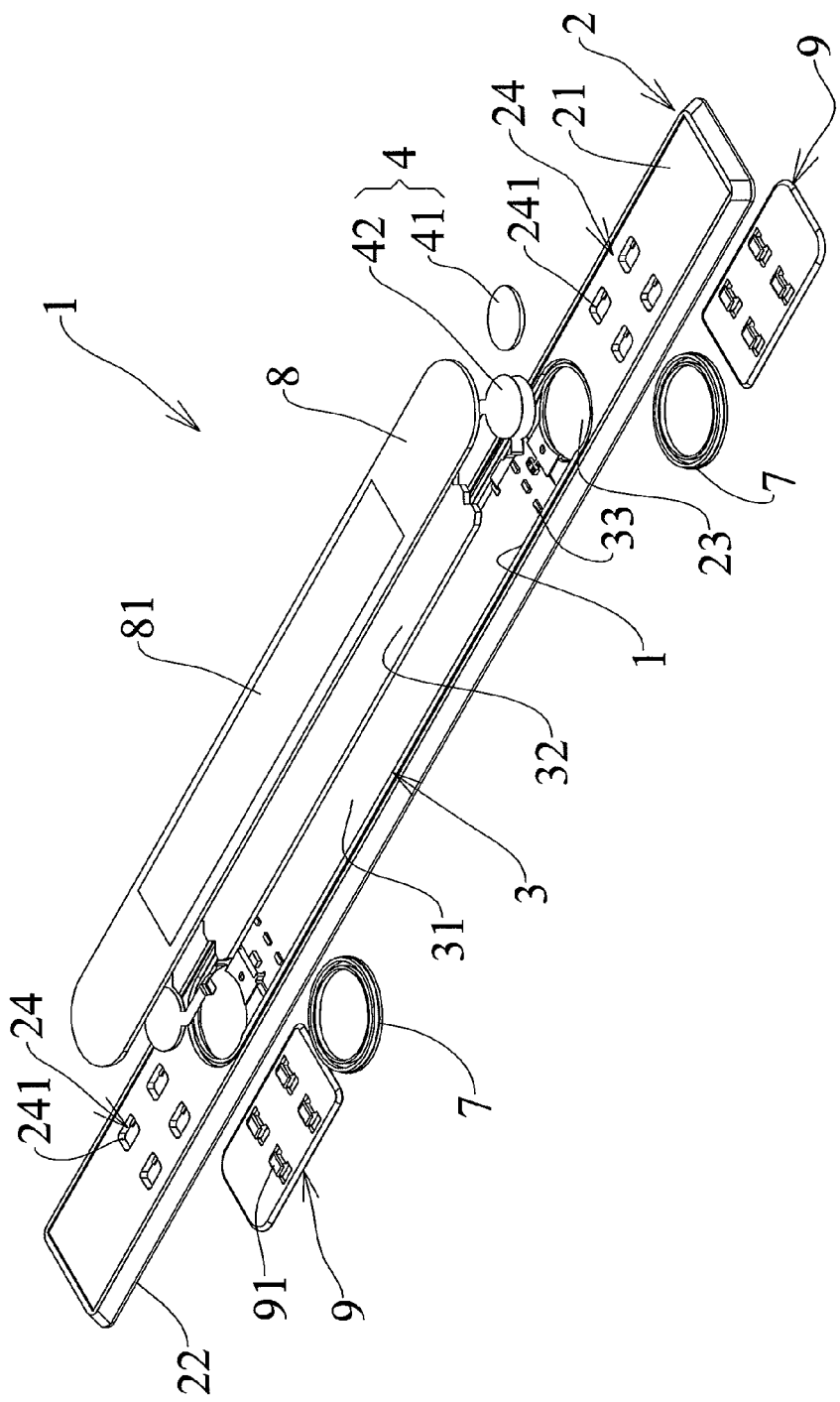
FIG. 1 is a diagram schematically showing the structure of a wireless light board according to one embodiment of the present invention.

The present invention will be described in detail with embodiments below. However, these embodiments are illustrated only to exemplify essential gist of the present invention and they thus cannot to be construed as a limit in the scope of the present invention.

The present invention discloses a wireless light board whose novel design can realize waterproofness, compactness, easy installation, convenient battery replacement, and high power efficiency. Some embodiments will be described in detail in cooperation with the attached drawings to exemplify the present invention. In addition to these embodiments, the present invention also widely applies to various other embodiments. Any substitution, modification or variation easily derived from the embodiments described in the specification is to be also included within the scope of the present invention, which is mainly according to the claims stated below. Many specified details are provided in the specification to enable the readers to more clearly understand the present invention. The present invention can still practice though some or all of these specified details are omitted. The well-known procedures or elements would not be mentioned in the description of the details lest the present invention be limited unnecessarily. Like or identical elements in the drawings would be denoted with like or identical symbols. The drawings are not used to indicate the practical dimensions or quantities but only used to illustrate the embodiments schematically. In order to simplify the drawings, the matterless details are not necessarily shown in the drawings.

Figure 2:
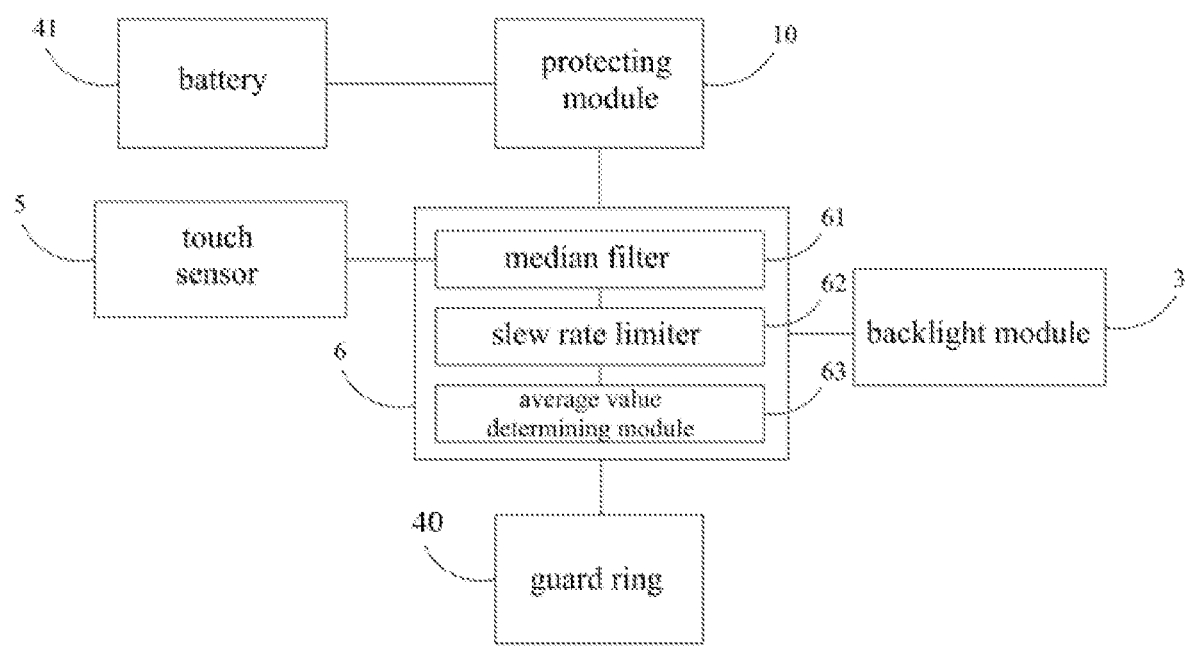
FIG. 2 is a block diagram schematically the system of a wireless light board according to one embodiment of the present invention.

Refer to FIG. 1 and FIG. 2. FIG. 1 is a diagram schematically showing the structure of a wireless light board according to one embodiment of the present invention; and FIG. 2 is a block diagram schematically the system of a wireless light board according to one embodiment of the present invention. As shown in FIG. 1, the wireless light board 1 of the present invention comprises a baseplate, 2 a backlight module 3 (shown in FIG. 2), a power module 4, a proximity sensor module 5 (shown in FIG. 2), a control module 6 (shown in FIG. 2), at least one bottom cover 7, a top cover 8 and a protecting module 10. The detailed structure thereof is described below.

As shown in FIG. 1, the baseplate 2 has an upper surface 21 and a lower surface 22 opposite to the upper surface 21, wherein the upper surface 21 has at least one recess 211; a power source accommodation hole 23 is formed on at least one side of the recess 211; and at least one side of the baseplate 2 has a positioning portion 24. In one embodiment, the positioning portions 24 are fabricated on two sides of the baseplate 2. However, the positioning portions 24 are not limited to be fabricated only on two sides of the baseplate 2.

The backlight module 3 is accommodated by the recess 211 and has at least one circuit board 31. In one embodiment, the backlight module 3 includes a light-guide plate 32 and a plurality of light-emitting elements 33, wherein the light-guide plate 32 is arranged above the circuit board 31, and the light-guide elements 32 are arranged on the circuit board 31 and at two sides of the light-guide plate 32. The light-emitting elements 33 may be but are not limited to be edge-lit LEDs. The light-guide plate 32 makes the light distributed uniformly. It can be understood that a plurality of dot patterns is utilized to form inside the light-guide plate 32 to effectively diffuse light. The power module 4 includes at least one battery 41 and at least one conductive strip 42, wherein the battery 41 is arranged inside the power source accommodation hole 23; and the conductive strip 42 electrically connects to the battery 41 and the circuit board 31. In this embodiment, the circuit board 31 includes an anti-electromagnetic interference structure which is formed by net copper layout.

As shown in FIG. 2, the proximity sensor module 5 is arranged on the circuit board 31 to sense an induction signal. In this embodiment, the proximity sensor module 5 is a touch sensor module, which is configured to detect variation of physical properties of it. For example, the touch sensor may include capacitors, and contact or proximity to the capacitors varies the capacitance value of them. When the wireless light board of the present invention is applied to a vehicle and mounted in a pedal under a door, the open or close of the door causes different capacitance value of the capacitor due to the proximity or separation of the door. When the door is opened or closed, the touch sensor module detects different capacitance values for the control module 6 to turn on or off the backlight module 3 accordingly.

The control module 6 is arranged on the circuit board 31 and electrically connected with the backlight module 4 and the proximity sensor module 5. The control module 6 turns on/off the backlight module 3 according to the induction signal sensed by the proximity sensor module 5. In one embodiment, the backlight module 3 is on neither normally-on nor normally-off status. The control module 6 can intelligently adjust the time interval of the turn-on or turn-off state according to the induction signal. In this embodiment, the protecting module 10 is connected to said battery and said control module. The protecting module protects said control module from short circuit caused by inverse mounting of the battery. The control module 6 further includes a median filter 61 and a slew rate limiter 62 configure to receive the induction signal from the touch sensor module 5 and filter noises of the induction signal. The control module 6 further includes an average value determining module 63 configured to receive the noise-filtered induction signal and shift the average value of the inductance signal by comparison of the noise-filtered induction signal with a previously determined average value of the inductance signal. When the noise-filtered induction signal is larger than the previously determined average value, the average value is added by a preset value, such as 1. When the noise-filtered induction signal is smaller than the previously determined average value, the average value is subtracted by a preset value, such as 1. Since the average value may depend on some environmental factors, such as temperature or humidity, the shifting of the average value provides control precision in consideration of the environmental factors. In this embodiment, a guard ring 40 is formed on the circuit board 31 to prevent current leakage.

The bottom cover 7 removably covers the power source accommodation hole 23 from the lower surface 22 of the baseplate 2 to seal the power module 4 inside. The top cover 8 is arranged on the upper surface 21 of the baseplate 2 and covers at least the backlight module 3 and the power module 4. The top cover 8 has at least one first light-permeable region 81 arranged above the backlight module 3 and allowing light to emit out. In one embodiment, the top cover 8 is stuck to a portion of baseplate 2 with a waterproof glue so as to enhance the waterproof effect. In another embodiment, the top cover 8 includes, but not limited to, a digitally-printed inscription plate.

Continuing the above description and referring still to FIG. 1, the positioning portion 24 of the baseplate 2 has at least one snap-fit hole 241. In order to enhance the convenience of changing the wireless light board, a light board fixing component 9 is arranged below the snap-fit hole 241 and fixed to the snap-fit hole 241 detachably. In one embodiment, at least one snap-fit hook 91 protrudes from the upper surface of the light board fixing component 9, snap-fitting into the snap-fit hole 241 and fastening the light board fixing component 9 and the baseplate 2 together. The light board fixing component 9 may be installed on an appropriate position in the vehicle or other place with an appropriate method, such as with a double-side adhesive tape.

Figure 3:
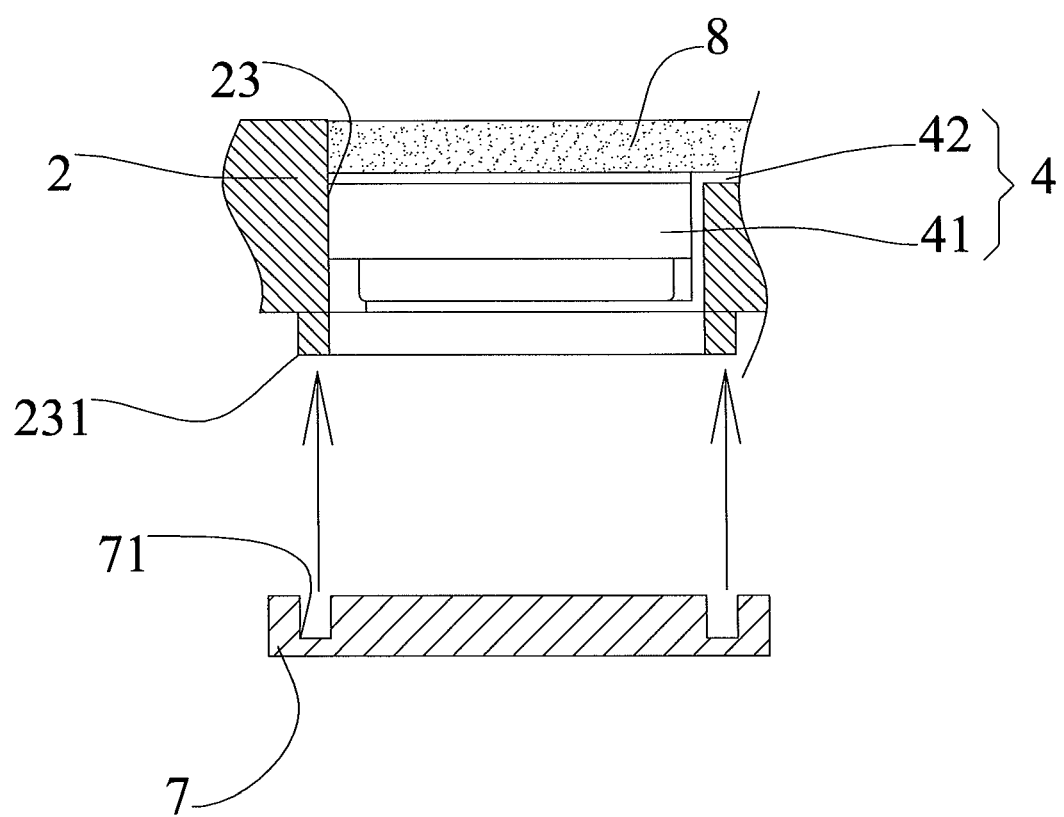
FIG. 3 is a local sectional view schematically showing the snap-fit structure of a power module according to one embodiment of the present invention.

In another embodiment, refer to FIG. 1 and FIG. 3. FIG. 3 is a local sectional view schematically showing the snap-fit structure of a power module according to one embodiment of the present invention. As shown in FIG. 3, in order to enhance the airtightness and waterproofness of the power module 4, a flange 231 is arranged along the rim of the power source accommodation hole 23 of the lower surface 22 and protrudes downward. The bottom cover 7 utilized to seal the power module 4 has a sealing groove 71 to be snap-fitted to the flange 231. The sealing groove 71 elongates the path along which humidity enters the power module 4 and achieves a waterproof rating of IPX6. Thereby, the interior of the wireless light board 1 would not be wetted by the flush of water or rain.

Figure 4:
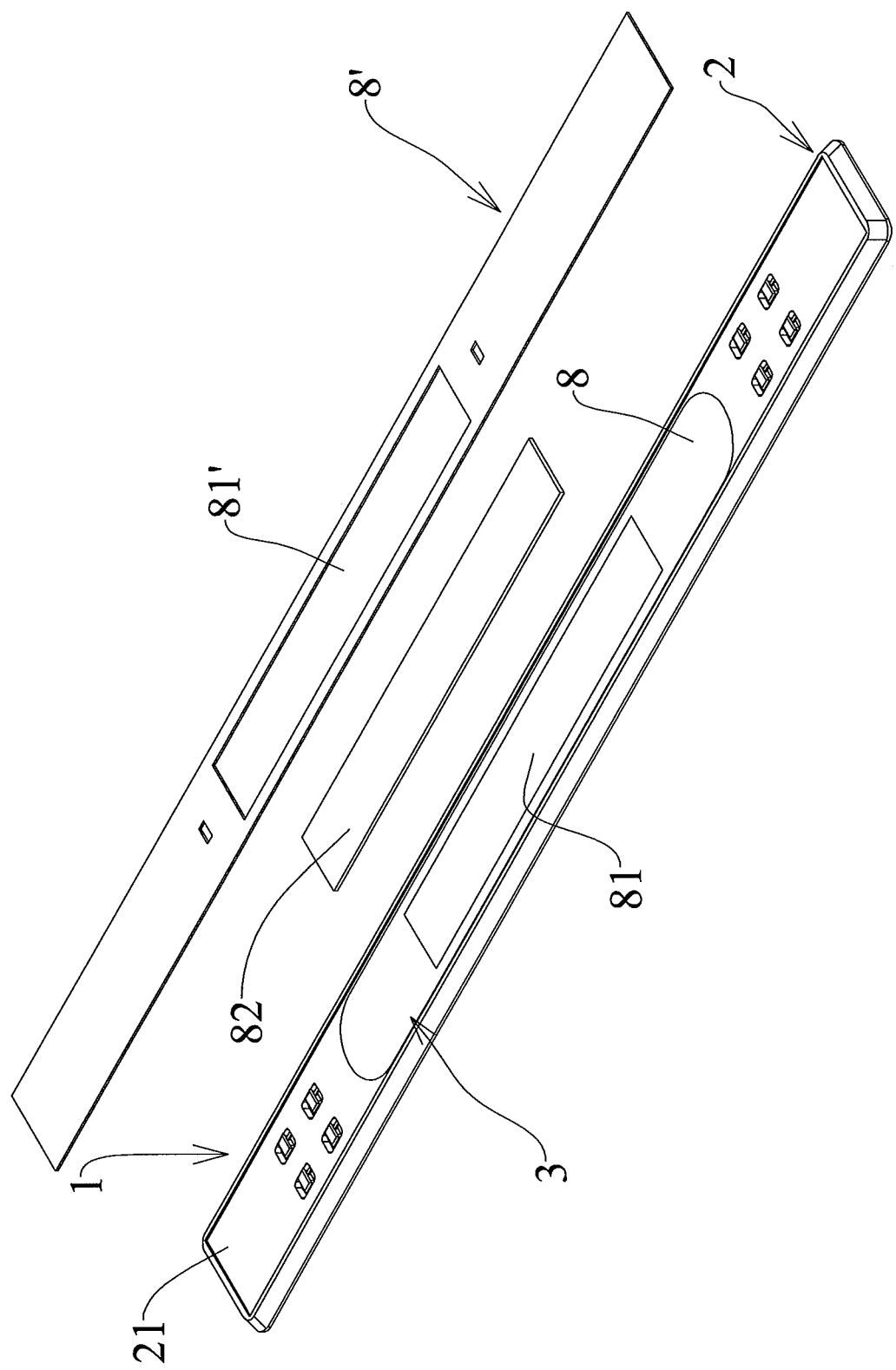
FIG. 4 is a diagram schematically showing the assemblage of a wireless light board according to one embodiment of the present invention.
Figure 5:
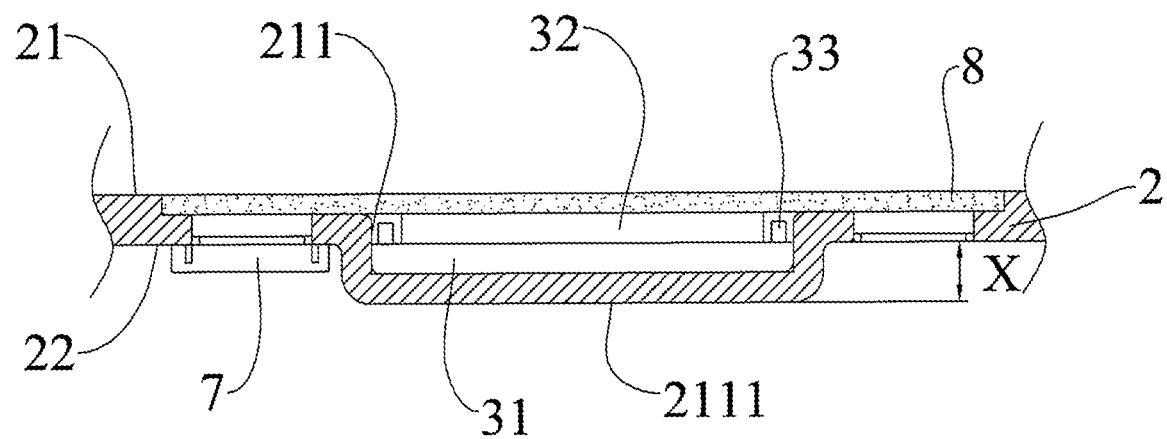
FIG. 5 is a local sectional view schematically showing the structure of a wireless light board according to one embodiment of the present invention.

Refer to FIG. 4 a diagram schematically showing the assemblage of a wireless light board according to one embodiment of the present invention. The assembled wireless light board 1 looks like a light strip. In one embodiment, the wireless light board 1 further comprises a stainless steel board 8' hoods and seals the baseplate 2 and the top cover 8. In one embodiment, the wireless light board 1 further comprises a laser-optical plastic board 82 arranged between the top cover 8 and the stainless steel board 8', wherein the stainless steel board 8' is fastened to the baseplate 2 and has a second light-permeable region 81' to expose a portion of the laser-optical plastic board 82. In one embodiment, the second light-permeable region 81' is a hollow region. The laser-optical plastic board 82 can be customized to have any desired letter, character, word, phrase or pattern. The laser-optical plastic board 82 can also be customized to have any letter, character, word, phrase or pattern with any desired color. In the present invention, the overall thickness of the wireless light board 1 is controlled to be within 3-5 mm to meet the requirement of slimness and compactness. In one embodiment, refer to FIG. 5. In order to realize the above-mentioned configuration in a limited space, there is a level difference x between the lower surface 22 of the body of the baseplate 2 and the lower surface 2111 of the recess 211, wherein the recess 211 is used to accommodate the backlight module 3, including the circuit board 31 and the light-guide plate 32. In one embodiment, the circuit board 31 is a membrane circuit board. The level difference x is sufficient to tolerate the thickness of the bottom cover 7 (only one side thereof is shown in FIG. 5), which covers the power module 4. Thereby, the wireless light board 1 can accommodate all the above-mentioned components although the wireless light board 1 is slimmed to have a limited thickness.

Figure 6:
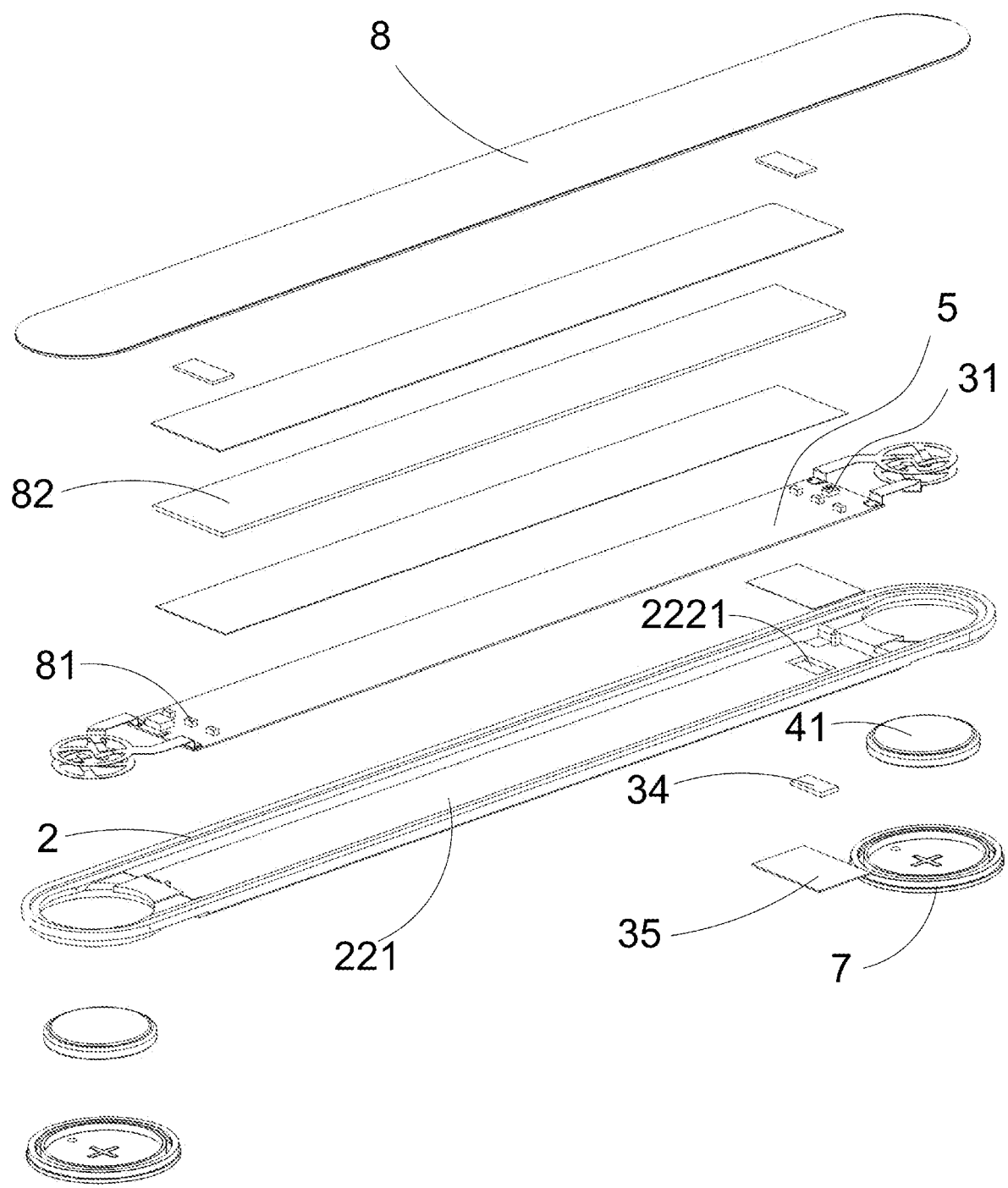
FIG. 6 is a perspective exploded view of another embodiment of a wireless light board of the present invention.
Figure 7:
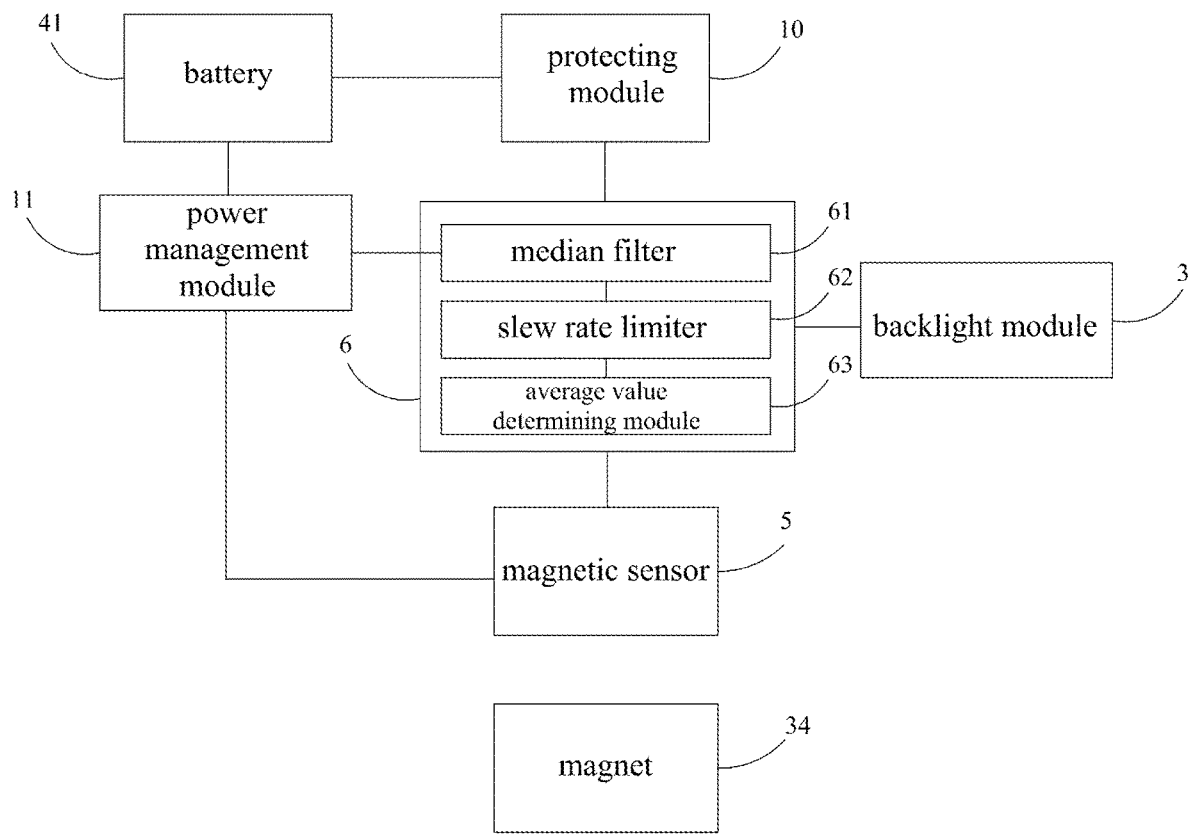
FIG. 7 is a cross section of the wireless light board of FIG. 6.

Referring to FIGS. 6 and 7, another embodiment of the wireless light board is disclosed. In this embodiment, the touch sensor module is replaced by a magnetic sensor module comprising a magnetic sensor and a magnet 34. The magnet 34 is received in a depression 2112 formed on the bottom of the recess 211, and the magnetic sensor is mounted on the circuit board 31. The magnetic sensor module can dynamically detect the magnetic field intensity of the magnet 34 and generate an induction signal, at any time no matter when the door is opened or closed.

Since the door is made by metal, when the door is moved in/out of the magnet, the vertical magnetic field component of the magnet will be changed. Then, it affects the magnetic field of the magnet 34 and varies the intensity of magnetic field near the magnetic sensor, depending on the distance between the magnet, the magnet sensor and the door whether it is opening or closed.

In general, the magnetic permeability of the door is about 4000 u. In view this, the magnet 34 and the magnetic sensor should be disposed in such a way that can effectively detect the variation or difference between the magnetic field intensity $MFI_{opening}$ detected by the magnetic sensor module while door is opening and the magnetic field intensity $MFI_{closed}$ detected by the magnetic sensor module while the door is closed.

According to the present invention, the magnet 34 is preferably spaced from the magnetic sensor by a specified distance D to enhance the variation or difference between the magnetic field intensity $MFI_{opening}$ and $MFI_{closed}$ to be obvious and thus detection precision is increased significantly as compared with prior art.

In general, the specified distance D is in the range of from 1 mm to 20 mm. Preferably, the specified distance D is in the range of from 1 mm to 10 mm. Since the magnet 34 and the magnetic sensor 5 are disposed in such manner, the detection precision of determining whether door of a car or a vehicle is opening or closed can be increased if the wireless light board of the invention is used.

According the present invention, the specified distance D between the magnet 34 and the magnetic sensor module 5 can be easily determined by the empirical formula:

$$D=0+k(Gm-G)$$

in which k represents an empirical coefficient determined by experiments, Gm represents maximum magnetic field intensity which is set as 65,535 Gauss; and G represents a detected magnetic field intensity of the magnet 34 in Gauss value.

The maximum magnetic field intensity Gm also can be set as a value other than 65535 Gauss for calculation of the specified distance D by using a computer program loaded in the control module 6. The empirical coefficient can be obtained by several experiments of interaction between different magnetic sensor module and magnets. The magnetic sensor module 5 can be a hall sensor or the reed switch.

Up to date now, the maximum detection distance Y measured as horizontal distance between door and magnet, where maximum variation of magnetic field intensity can be detected by using wireless light board of the prior art, is merely 5 mm or less. However, according to the present invention, the maximum detection distance Y can be increased up to 15 mm or more.

Further, the maximum detection distance Y could be selected corresponding to the size of magnet used in a wireless light board. If the size of magnet is smaller, the maximum detection distance Y will preferably to be set as bigger. For example, if magnet size (L*W*H) is 10*5*1 (mm) or 10*5*2 (mm), the maximum detection distance Y is proposed being set as 15 mm. if magnet size (L*W*H) is 30*10*1 (mm) or 20*10*1 (mm), the maximum detection distance Y is proposed being set as 20 mm.

According to several embodiments of the present invention, the empirical coefficient k could be set as that shown on the table below.

| Example | Magnet size L*W*H (mm) | D (mm) | Gm | k | Y (mm) |
|---------|------------------------|--------|-----|------------------------|--------|
| 1 | 10*5*1 | 5 | 52 | $7.635 \times 10^{-5}$ | 15 |
| 2 | 10*5*2 | 10 | 100 | $1.528 \times 10^{-4}$ | 15 |
| 3 | 30*10*1 | 10 | 66 | $1.528 \times 10^{-4}$ | 20 |
| 4 | 20*10*1 | 7.5 | 50 | $1.145 \times 10^{-4}$ | 20 |

Figure 9:
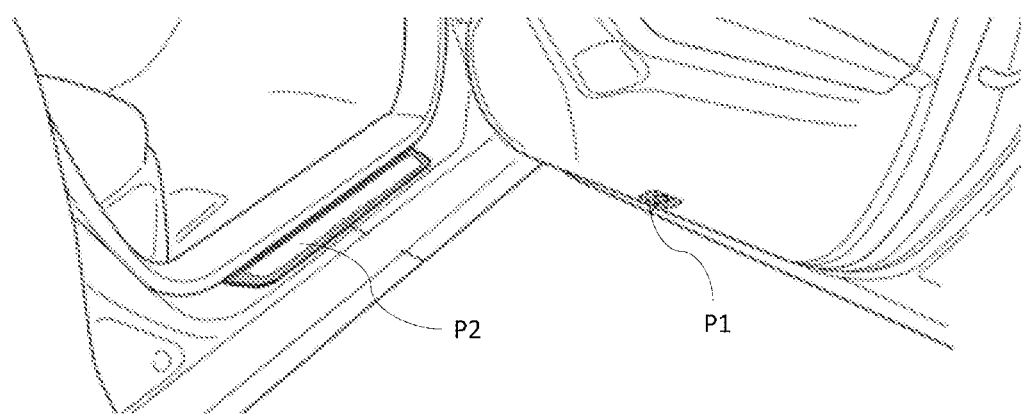
FIG. 9 is an illustrated drawing showing that a magnet and HALL sensor are combined with a visual effects pedal or a lighting welcome pedal of the prior art, for detection out whether the door is opening or closed.

Furthermore, in a visual effects pedal or a lighting welcome pedal of the prior art, a magnet P1 and HALL sensor P2 are usually used for detection out whether the door is opening or closed. The HALL sensor P2 and the magnet P1 are generally attached on the front scuff plate of the door as shown in FIG. 9. When the door is closed gradually, the magnet P1 will corresponding become above the HALL sensor P2 and thus it should pay attention to keep the position of the magnet P1 and the HALL sensor P2 in order to match each other.

In other words, this type magnet sensor of prior art will cause a problem in alignment of magnet and the sensor to ensure that the approach of the magnet can be detected by the sensor. For example, if the distance between the magnet and HALL sensor is more than 3 mm, this type magnet sensor of prior art will cause a problem on detection accuracy. Accordingly, in order to prevent from the problem that the sensor may fail to ensure whether the door is opening or closed can be correctly detected out, the distance between the magnet and HALL sensor should be kept within 3 mm or less.

Additionally, the magnetic force of the N/S poles of the magnets is different, and the sensing range of the sensors is also different. For example, as shown in FIG. 10, the sensor detection area for N pole is 5 mm×5 mm and the sensor detection area for N pole is 10 mm×12.5 mm.

Figure 11:
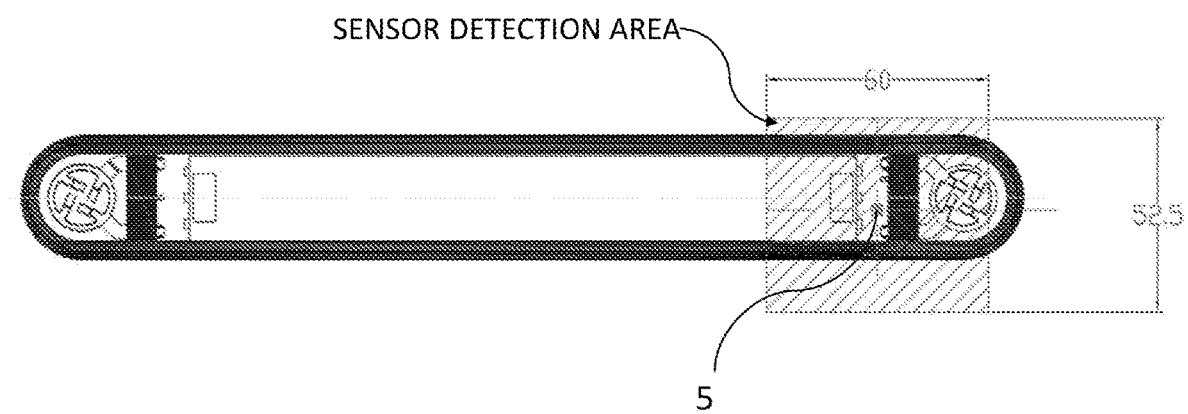
FIG. 11 is an illustrated drawing showing the installation of magnet sensor module comprising a magnet and a magnet sensor which is disposed in the wireless light board according to the invention of the present application, and detection area for detecting variation of magnetic field intensity by using the magnet sensor module.
Figure 12:
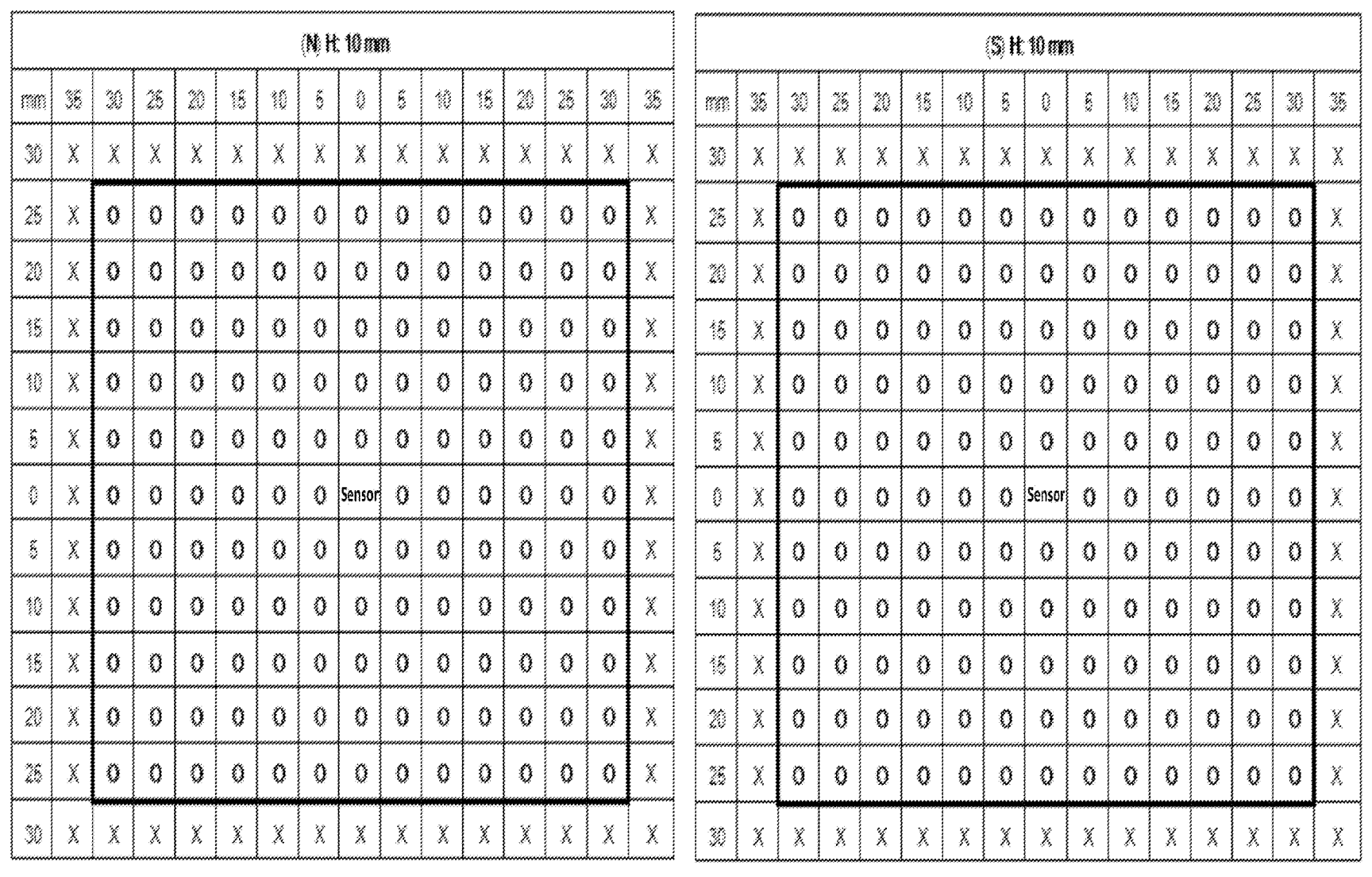

On the other hand, according to the invention of present application, the sensor detection area will be 60 mm×52.5 mm under the same condition of "10 mm Hight between metal (SGCC) and scuff plate" as shown in FIG. 11 and FIG. 12.

Furthermore, the maximum detection distance Y could be selected corresponding to the size of magnet used in a wireless light board. If the size of magnet is smaller, the maximum detection distance Y will preferably to be set as bigger. For example, if magnet size (L*W*H) is 10*5*1 (mm) or 10*5*2 (mm), the maximum detection distance Y is proposed being set as 15 mm. if magnet size (L*W*H) is 30*10*1 (mm) or 20*10*1 (mm), the maximum detection distance Y is proposed being set as 20 mm.

Besides, while using, the power consumption of the wireless light board according to the invention of the present application is lower 5 μA as shown on some embodiments listed on the table below.

| Example | Duty Cycle (on/off) (ms) | MCU ON current (μA) | MCU Sleep current (μA) | Sensor ON current (μA) | Sensor OFF current (μA) |
|---------|--------------------------|---------------------|------------------------|------------------------|--------------------------|
| 1 | 4/128 | 300 | 0.1 | 55 | 0 |
| 2 | 4/256 | 300 | 0.1 | 55 | 0 |
| 3 | 4/512 | 300 | 0.1 | 55 | 0 |
| 4 | 4/1024 | 300 | 0.1 | 55 | 0 |

| Example | ON (ms) | OFF (ms) | Power Consumption (uA) |
|---------|---------|----------|------------------------|
| 1 | 4 | 128 | 10.8 (=((300 + 55) × 4 + 0.1 × 132)/132) |
| 2 | 4 | 256 | 5.5 (=((300 + 55) × 4 + 0.1 × 260)/260) |
| 3 | 4 | 512 | 2.8 (=((300 + 55) × 4 + 0.1 × 516)/516) |
| 4 | 4 | 1024 | 1.5 (=((300 + 55) × 4 + 0.1 × 1028)/1028) |

According to the results of comparison the invention with the prior art on detection whether the door of a car is opening or closed, it is confirmed that the wireless light board of the invention has excellent performance superior to the magnet sensor module of the prior art.

Especially, according to the summary as shown on the table below, the wireless light board of the invention has compact size, lower consumption, farer detecting distance, larger detecting area, higher sensitivity as compared with the visual effects pedal or a lighting welcome pedal of the prior art.

| Item | The invention | Prior art |
|------|---------------|-----------|
| Power consumption | less than 5 uA | about 5 uA |
| Detecting distance | 20 mm or more | about 15 mm |
| Detecting area (sensitivity) | 60 mm × 52.5 mm | 5 mm × 5 mm |

In this embodiment, the control module 6 also includes the median filter 61, the slew rate limiter 62 and the average value determining module 63 as the embodiment of FIG. 2. In this embodiment, the wireless light board also includes the protecting module 10 as the embodiment of FIG. 2. In this embodiment, the wireless light board a power management module 11 connected to the battery 41 and the magnetic sensor module 5, wherein the control module 6 controls the power management module 11 to turn on and off the magnet sensor module 5 for reducing power consumption.

Figure 8:
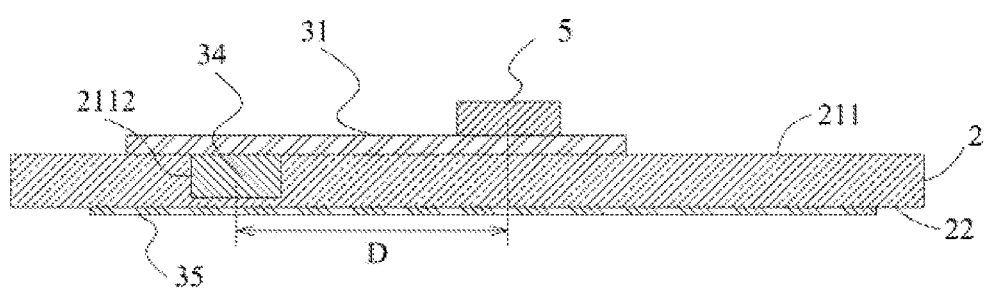
FIG. 8 is a block diagram of the wireless light board of FIG. 6.

Referring to FIG. 8, the wireless light board of this embodiment further includes a magnetic inductance metal member 35 disposed on the lower surface 22 of the base plate 2 and corresponding to the magnet 34. The magnetic inductance metal member 35 can be an iron plate. The magnetic inductance metal member 35 can be inducted by the magnet 34 to enhance the intensity of the magnetic field and thus increase the detecting distance of the magnetic sensor module 5.

In this embodiment, the top cover 8 is non-magnetic and thus does not affect the magnetic field of the magnet 34.

The present invention is characterized in replacing the conventional sensor with a proximity sensor or a contactless touch sensor; using the proximity sensor or the contactless touch sensor to sense whether the door of the vehicle or the house is open or not and enable the control module to turn on or turn off the lights or control the time of the persistence of lighting whether a magnet is used or not; using a fast detachable battery cover to enable users to replace batteries easily; and adopting an ultra thin light-diffusing backlight module to decrease the overall thickness. The present invention also has the features: the top cover and the laser-optical plastic board can be customized and fast changed according to the requirement of customers; the wireless light board can be easily detached from the main body for cleaning, battery replacement or even being used in a different main body (such a different vehicle); the sealing of the top cover and bottom cover achieves a IPX6 waterproof rating; and the intelligent power management can prolong the life cycle of the wireless light board.

In conclusion, the present invention proposes a novel wireless light board, which is slim, waterproof, power-saving, easy to install, convenient for battery replacement and can solve the problem of misalignment.

The embodiments have been described above to demonstrate the technical contents and characteristics of the present invention and enable the persons skilled in the art to understand, make, and use the present invention. However, these embodiments are not intended to limit the scope of the present invention. Contrarily, any equivalent modification or variation according to the spirit of the present invention would be also included within the scope of the claims of the present invention. The claims of the present invention should be interpreted in the broadest sense to cover all the equivalent modifications and variations.

What is claimed is:

1. A wireless light board with compact package size, large detection area, lower power consumption and high sensitivity, which is characterized in comprising:
    a baseplate having an upper surface and a lower surface, wherein said upper surface has at least one recess of rectangular shape, and wherein at least one side of said recess has a power source accommodation hole, and wherein a positioning portion is defined on at least one side of said baseplate;
    a backlight module accommodated by said recess and having at least one circuit board;
    a power module including at least one battery and at least one conductive strip, wherein said battery is arranged inside said power source accommodation hole, and wherein said conductive strip is used to electrically connect said battery and said circuit board;
    a magnet disposed on said recess;
    a magnetic sensor module arranged on said circuit board, spaced from said magnet by a specified distance D and configured to detect variation of magnetic field intensity of said magnet and generate an induction signal, wherein the specified distance D is in a range of from 1 mm to 10 mm and determined by an empirical formula:

$$D=0+k(Gm-G)$$

in which k represents an empirical coefficient determined as $1.528 \times 10^{-4}$, Gm represents maximum magnetic field intensity which is set as 65,535 Gauss; and G represents a detected magnetic field intensity of said magnet in Gauss value;
    a control module arranged on said circuit board, electrically connected with said backlight module and said magnetic sensor module, and used to turn on said backlight module when the induction signal is smaller than an average value and turn off said backlight module when the induction signal is greater than an average value;
    at least one bottom cover removably covering said power source accommodation hole from said lower surface of said baseplate;
    a top cover arranged on said upper surface of said baseplate, covering at least said backlight module and said power module, and having at least one light-permeable region above said backlight module; and
    the sensor detection area of the wireless light board is extended to be L×W=60 mm×52.5 mm.

2. The wireless light board according to claim 1, of which the power consumption is lower 5 µA while using.

3. The wireless light board according to claim 1, further comprising a magnetic inductance metal member disposed on said lower surface and corresponding to said magnet.

4. The wireless light board according to claim 1, further comprising a protecting module connected to said battery and said control module, wherein said protecting module protects said control module from short circuit.

5. The wireless light board according to claim 1, further comprising a power management module connected to said battery and said magnetic sensor module, wherein said control module controls said power management module to turn on and off said magnet sensor module.

6. The wireless light board according to claim 1, wherein the control module comprises a median filter and a slew rate limiter configure to receive the induction signal from the magnetic sensor module and filter noises of the induction signal.

7. The wireless light board according to claim 6, wherein the control module further comprises an average value determining module configured to receive the noise-filtered induction signal and shift the average value of the inductance signal by comparison of the noise-filtered induction signal with a previously determined average value of the inductance signal.

8. The wireless light board according to claim 1, wherein said backlight module includes a light-guide plate and a plurality of light-emitting elements, wherein said light-guide plate is arranged above said circuit board, and said light-emitting elements are arranged on said circuit board and at two sides of said light-guide plate.

9. The wireless light board according to claim 1, wherein said top cover is a digitally-printed inscription plate.

10. The wireless light board according to claim 1 further comprising a laser-optical plastic board arranged above said top cover, which is non-magnetic and arranged on said baseplate to expose a portion of said laser-optical plastic board.

11. The wireless light board according to claim 1, wherein a level difference is formed between a lower surface of the main body of said baseplate and a lower surface of said recess.

* * * * *